United States Patent
Kumar

(10) Patent No.: US 8,659,929 B2
(45) Date of Patent: Feb. 25, 2014

(54) AMORPHOUS SILICON RRAM WITH NON-LINEAR DEVICE AND OPERATION

(75) Inventor: Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 54 days.

(21) Appl. No.: 13/174,264

(22) Filed: Jun. 30, 2011

(65) Prior Publication Data

US 2013/0003436 A1    Jan. 3, 2013

(51) Int. Cl.
*G11C 17/00* (2006.01)

(52) U.S. Cl.
USPC ............................. 365/100; 365/148; 365/163

(58) Field of Classification Search
USPC ............................. 365/148, 163, 189.14, 100
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,627,451 A | 5/1997 | Takeda |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |

(Continued)

FOREIGN PATENT DOCUMENTS

| | | |
|---|---|---|
| EP | 2405441 A1 | 1/2012 |
| EP | 2408035 A2 | 1/2012 |
| KR | 1020110014248 A | 2/2011 |
| WO | WO 2009/005699 A1 | 1/2009 |

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Gene Auduong
(74) *Attorney, Agent, or Firm* — Ogawa P.C.

(57) ABSTRACT

A non-volatile memory device includes a resistive switching device having a first electrode, a second electrode, and a resistive switching element, wherein the resistive switching element comprises a silicon material disposed in an overlapping region between the first electrode and the second electrode, wherein the second electrode comprises at least a metal material physically and electrically in contact with the resistive switching material, wherein the resistive switching element is characterized by a resistance depending on an electric field in the resistive switching element, and a non-linear device coupled between the first electrode and the resistive switching element, wherein the non-linear device is configured to conduct electric current when a voltage greater than a first voltage is applied to the second electrode, wherein the resistive switching device is configured to change from a first state to a second state in response to the first voltage.

22 Claims, 4 Drawing Sheets

(56) References Cited

U.S. PATENT DOCUMENTS

| | | |
|---|---|---|
| 6,128,214 A | 10/2000 | Kuekes et al. |
| 6,143,642 A | 11/2000 | Sur, Jr. et al. |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 * | 9/2008 | Scheuerlein ............... 365/63 |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,667,442 B2 | 2/2010 | Itoh |
| 7,704,788 B2 | 4/2010 | Youn et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 * | 8/2012 | Kreupl et al. ............... 257/4 |
| 8,258,020 B2 | 9/2012 | Herner |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0062045 A1 | 3/2005 | Bhattacharyya |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0069119 A1 | 3/2007 | Appleyard et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0019163 A1 | 1/2008 | Hoenigschmid et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0206931 A1 | 8/2008 | Breuil et al. |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 * | 10/2009 | Chen et al. ............... 365/148 |
| 2009/0298224 A1 | 12/2009 | Lowrey |
| 2009/0321706 A1 | 12/2009 | Happ et al. |
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 * | 6/2010 | Kumar et al. ............... 365/148 |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |

(56) References Cited

U.S. PATENT DOCUMENTS

| | | |
|---|---|---|
| 2010/0277969 A1 | 11/2010 | Li et al. |
| 2010/0321095 A1 | 12/2010 | Mikawa et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0310656 A1 | 12/2011 | Kreupl et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0235112 A1 | 9/2012 | Huo et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60,1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

*Ex parte Quayle* Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.

(56) References Cited

OTHER PUBLICATIONS

Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and its Alloys", Journal of Non-Crystalline Solids, 1989, pp. 1-13, vol. 115, Elsevier Science Publishers B.V., North-Holland.
J. Hu, et al., "AC Characteristics of Cr/p+a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
International Search Report and Written Opinion for PCT/US2011/040362 filed on Jun. 14, 2011.
Office Action for U.S. Appl. No. 12/815,369 dated Mar. 14, 2012.
Notice of Allowance for U.S. Appl. No. 12/815,369 dated May 22, 2012.
Office Action for U.S. Appl. No. 12/834,610 dated Apr. 16, 2012.
R C Newman, "Defects in silicon", Rep. Prog. Phys., 1982, pp. 1163-1210, vol. 45, The Institute of Physics, Great Britain.
Office Action for U.S. Appl. No. 13/149,757 dated Jun. 19, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.

(56) References Cited

OTHER PUBLICATIONS

Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Office Action of U.S. Appl. No. 13/436,714 dated Dec. 7, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Notice of Allowance for U.S. Appl. No. 13/769,152, dated Oct. 8, 2013.
Notice of Allowance for U.S. Appl. No. 13/905,074, dated Oct. 8, 2013.
Notice of Allowability for U.S. Appl. No. 13/452,657, dated Oct. 10, 2013.
Notice of Allowability for U.S. Appl. No. 13/417,135, dated Oct. 23, 2013.

* cited by examiner

AMORPHOUS SILICON RRAM WITH NON-LINEAR DEVICE AND OPERATION

CROSS REFERENCE TO RELATED APPLICATIONS

Not Applicable

STATEMENTS RELATED TO GOVERNMENT OR FEDERALLY FUNDED RESEARCH

Not Applicable

BACKGROUND

The present invention is generally related to resistive switching devices. More particularly, embodiments according to the present invention provide a method and a structure for forming a resistive switching device coupled to a non-linear device. The present invention can be applied to non-volatile memory devices but it should be recognized that the present invention can have a much broader range of applicability.

The inventors of the present invention have recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventors of the present invention recognize that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically include Joules heating and undesirably require high power consumption.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure for forming a resistive switching device coupled to a non-linear device. The present invention can be applied to non-volatile memory devices but it should be recognized that the present invention can have a much broader range of applicability.

In a specific embodiment, a non-volatile memory device is provided. The non-volatile memory device includes a resistive switching device. In a specific embodiment, the resistive switching device includes a first electrode, a second electrode, and a resistive switching element disposed in an intersection region between the first electrode and the second electrode. The resistive switching element can include a silicon material in a specific embodiment. In a specific embodiment, the second electrode includes at least a metal material physically and electrically in contact with the resistive switching material. In a specific embodiment, the non-volatile memory device includes a non-linear device disposed in between the first electrode and the resistive switching element and serially connected to the resistive switching element. The non-linear device is conigured to conduct electric current when a voltage greater than a first voltage is applied to the second electrode. The first voltage causes the resistive switching device to change from a first state to a second state in a specific embodiment. Depending on the embodiment, the first state can be a high resistance state and the second state can be a low resistance state. Alternatively, the first state can be a low resistance state and the second state can be a high resistance state.

In a specific embodiment, a method of programming a memory cell in an array of non-volatile memory devices is provided. The method includes providing a plurality of memory cells arranged in an array. Each of the plurality of memory cells includes a resistive switching device and a non-linear device serially coupled to the resistive switching device. In a specific embodiment, the resistive switching device includes at least a first electrode, a second electrode, and a resistive switching material. The resistive switching material includes a silicon material in a specific embodiment. The first electrode includes at least a silver material in a specific embodiment. The non-linear device is disposed between the second electrode and the resistive switching material in a specific embodiment. In a specific embodiment, each of the memory cells has a first current flowing in the respective resistive switching device. The first current can be a dark current in each of the device in a specific embodiment. The method includes selecting a first memory cell and applying a first voltage to the first memory cell. The first voltage is configured to cause the non-linear device, e.g., punch-through diode, to conduct current and to cause the resistive switching device associated with the first memory cell to change from the first state to a second while the first current from other memory cells is blocked from flowing in the first memory cell by a second voltage drop across the respective non-linear device in other memory cells.

According to one aspect of the invention, a non-volatile memory device is described. One device includes a resistive switching device comprising a first electrode, a second electrode, and a resistive switching element, wherein the resistive switching element comprises a silicon material disposed in an overlapping region between the first electrode and the second electrode, wherein the second electrode comprises at least a metal material physically and electrically in contact with the resistive switching material, wherein the resistive switching element is characterized by a resistance depending on an electric field in the resistive switching element. A device may include a non-linear device coupled between the first electrode and the resistive switching element, wherein the non-linear device is configured to conduct electric current when a voltage greater than a first voltage is applied to the second electrode. In various embodiments, the resistive switching device is configured to change from a first state to a second state in response to the first voltage.

According to another aspect of the invention, a method of programming a memory cell in an array of non-volatile memory devices is described. One technique includes providing a plurality of memory cells arranged in an array, wherein each of the plurality of memory cells comprises a resistive switching device and a non-linear device serially coupled to the resistive switching device, wherein each of the memory cells have a first current flowing in respective resistive switching devices, wherein the resistive switching device comprise at least a first electrode, a second electrode, and a resistive switching material, wherein the resistive switching material comprises a silicon material, wherein the first electrode comprises at least a silver material, and wherein the non-linear device is disposed in between the second electrode and the resistive switching material. A process may include selecting a first memory cell, and applying a first voltage to the first memory cell, wherein the first voltage is greater than a voltage to cause the non-linear device to conduct a first current and to cause the resistive switching device associated with the first memory cell to change from a first state to a second state, while a first current from other memory cells is blocked from flowing in the first memory cell by a second voltage drop across respective non-linear devices associated with other memory cells.

Many benefits can be achieved by ways of present invention over conventional techniques. Embodiments according to the present invention provide a device structure and a programming method for a non-volatile memory device. The device structure includes a non-linear device to suppress leakage current from interfering with write, erase as well as read operations in a specific embodiment. Depending on the embodiment, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is directed to switching devices. More particularly, embodiments of the present invention provide a method and device structure for a resistive switching device coupled to a non-linear device, e.g., diode, to prevent leakage current for proper operations of the resistive switching device. Embodiments of the present invention have been applied to a crossbar array of non-volatile memory device using a silicon material as resistive switching material. But it should be recognized that embodiments of the present invention have a broader range of applicability.

High density and low cost storage devices are in ever increasing demand due to the growth in consumer devices common in the market place. Current non-volatile memory devices including Flash are probably approaching an end to further scaling due to fundamental limitations in the devices. It is predicted that current charge storage in a floating gate or a dielectric material in Flash may not be possible in device size less that about 10 nm. A new category of devices using an interconnected crossbar configuration that can be vertically integrated in a three dimensional manner provides a high device density not achievable in current memory devices.

However, leakage current from cells in an interconnected crossbar array can affect proper operations (read, write, or erase) of the device. To suppress the leakage current and to isolate a cell from the leakage current, certain rectifiers can be used. A conventional rectifier usually limits current to flow in a single direction, and can only work for a forward bias operation or a reverse bias operation and not for both. Thus conventional rectifiers are of limited applicability. Certain switching devices can have symmetrical current-voltage (IV) behavior, but such devices do not generally work well in a crossbar array. Other rectifying devices may have a low on-state current but can have poor data retention characteristics. Embodiments of the present invention provide a device structure that includes at least a non-linear device and related methods for a resistive switching device that is rectifying and yet allows current to flow in forward bias as well as in reverse bias operations.

Figure 1:
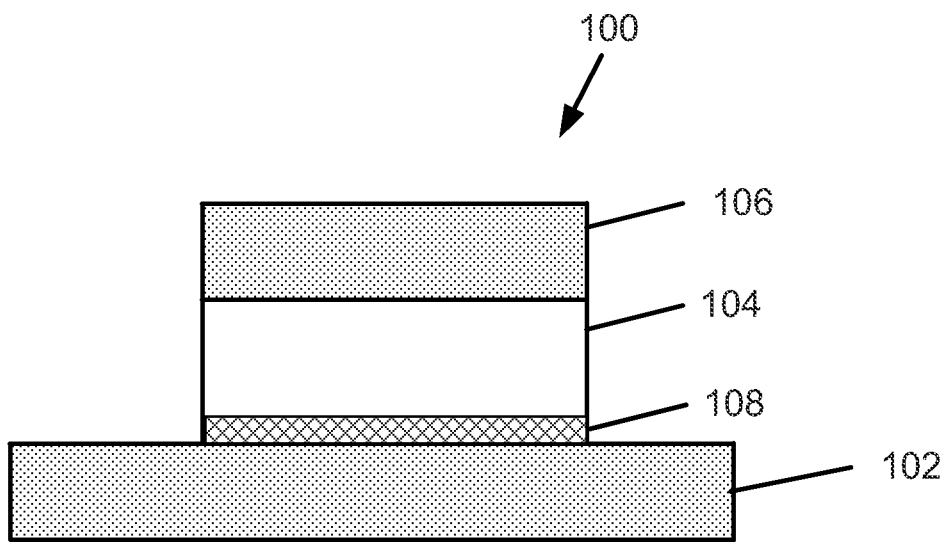
FIG. 1 is a simplified diagram illustrating a resistive switching device according to an embodiment of the present invention.

FIG. 1 is a simplified diagram illustrating a resistive switching device 100 according to an embodiment of the present invention. The resistive switching device includes a first electrode 102, a second electrode 106, and a resistive switching material 104 sandwiched between the first electrode and the second electrode. As merely an example, the first electrode can be a first conductor material. The first electrode 102 can include a first conductive material such as a first metal material or a doped semiconductor material. In a specific embodiment, the first metal material can be tungsten, aluminum, copper or other suitable metal that is compatible with CMOS fabrication techniques. In a specific embodiment, the first electrode is elongated in shape and extends in a first direction.

The resistive switching material 104 can include a suitable insulator material having a resistance that can be altered upon application of an electric field to the insulator material. In a specific embodiment, the resistive switching material can include a silicon material. For example, the silicon material can be an amorphous silicon material, a microcrystalline silicon material, a macro crystalline silicon material, a silicon germanium material including any combination of these materials, or the like. In an embodiment, the silicon material includes an amorphous silicon material.

Figure 2:
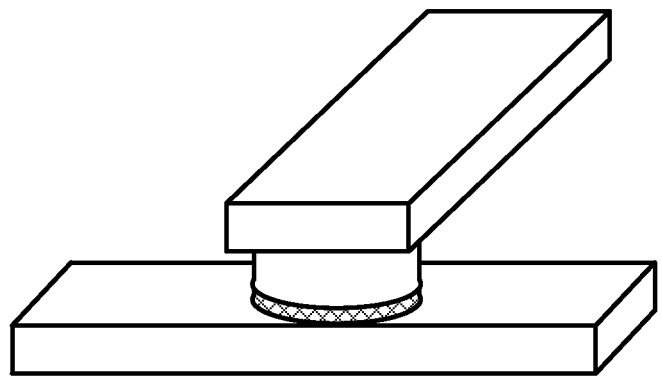
FIG. 2 is a simplified diagram illustrating a resistive switching device arranged in a crossbar configuration according to an embodiment of the present invention.

The second electrode 106 can comprise a second conductive material and can have a portion that includes a second metal material. The second metal material can be aluminum, nickel, silver, gold, palladium, platinum, or another similar metal or combination of metals. The second metal material typically is characterized by a suitable diffusivity into the resistive switching material in a specific embodiment. In a specific embodiment, the second electrode 106 is elongated in shape and extends in a second direction that is orthogonal to the first direction, as illustrated in FIG. 2. In a specific embodiment, the second metal material includes a silver material.

In certain embodiments, the resistive switching device further includes a contact material 108 disposed between the metal material of the first electrode 102 and the amorphous silicon material 104. The contact material is believed to provide a suitable interfacial defect characteristic for desirable switching behavior for the resistive switching device. For amorphous silicon material as the resistive switching material, the contact material can be p+ polysilicon material, p+ silicon germanium material, or the like. In certain embodiments, the contact material can be optional. The resistive switching device can be disposed in an N by M crossbar array with pillars of resistive switching material 104 located at the crossings of the array, to form a high density interconnected array of non-volatile memory cells.

Figure 5:
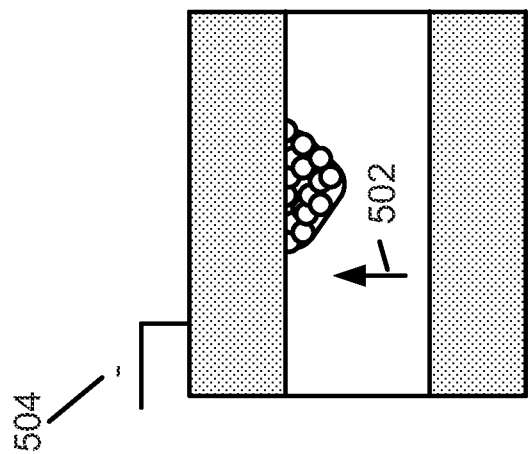
FIGS. 3, 4, and 5 are simplified diagrams illustrating a resistive switching mechanism of the resistive switching device according to an embodiment of the present invention.
Figure 4:
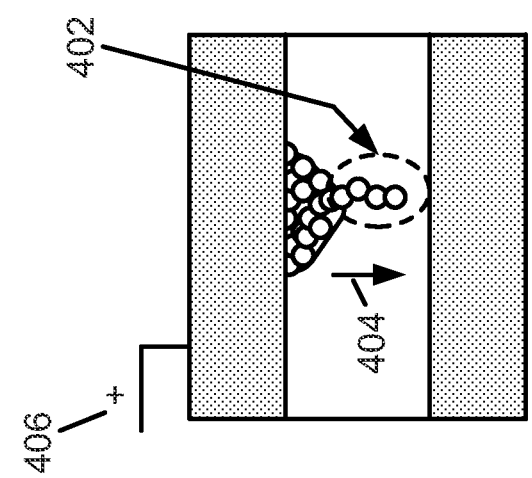
Figure 3:
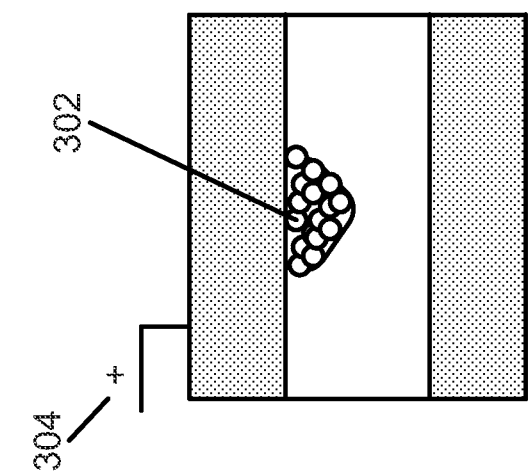

FIGS. 3-5 are simplified diagrams illustrating operations of a resistive switching device. As shown in FIG. 3, the second metal material forms a metal region 302 in a portion of the resistive switching material 104 when a first positive voltage 304 greater than a threshold voltage is applied to the second electrode 106. The threshold voltage is the forming voltage for the resistive switching device. In this configuration, the resistive switching device is at a high resistance state, otherwise known as an erase state, or an "OFF" state.

As shown in FIG. 4, the metal region may further form a filament region 402. The filament region 402 may be characterized by a length, a first distance between metal particles, a second distance between the filament and the first electrode 102, and the like. In FIG. 4, the filament extends in a direction 404 towards the first electrode 102 when a second positive bias voltage 406 is applied to the second electrode 106. In this configuration the resistive switching device 104 is in a low resistance state, otherwise known as a programmed or "ON" state, allowing current to flow through the resistive switching device 104.

As illustrated in FIG. 5, the filament structure 402 retracts in a direction 502 away from first electrode 102, when a negative bias voltage 504 or an erase voltage is applied to the second electrode 106. In this configuration, the resistive switching device 104 is reverted back to the high resistance state illustrated in FIG. 3. Accordingly, as shown in FIGS. 3-5, the resistive switching device 100 is considered a two-terminal or a bipolar device.

Due to the interconnectivity of a crossbar structure, when an operating voltage (e.g. e.g. the second positive bias voltage 406) is applied to a selected cell, leakage current from unselected cells can form a leakage path, that affects operations of the selected cell. Leakage current from the selected cell can also affect the states of unselected cells in the leakage path. As an example of this, in a situation where a selected cell is at a high conductance state, leakage current from the high conductance cell can erase an unselected cell also in the high conductance state in the leakage path.

Figure 6:
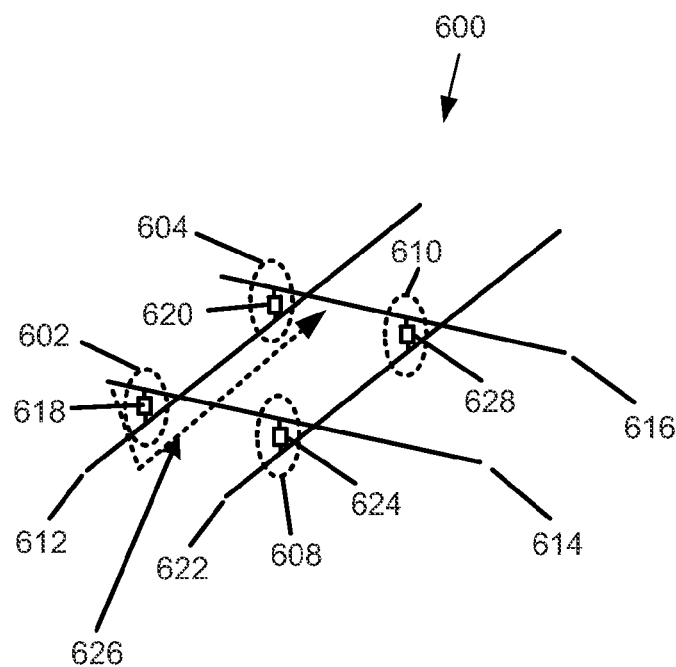
FIG. 6 is a simplified diagram illustrating a portion of a crossbar array and a leakage current path according to an embodiment of the present invention.

FIG. 6 is a simplified diagram illustrating a crossbar array of memory cells 600. Four cells 602, 604, 608, and 610 are illustrated. Cell 602 includes a first bottom electrode 612, a first top electrode 614, and a first resistive switching region 618. Cell 604 shares the same first bottom electrode 612 as cell 602, and includes a second top electrode 616 and a second resistive switching region 620. Cell 608 shares the same first top electrode 614 as cell 602, and includes a third bottom electrode 622 and a third resistive switching region 624. Cell 610 shares the same first top electrode 616 as cell 602, and the same bottom electrode 622 as cell 608 and a fourth resistive switching region 628.

An example of a programming operation of an embodiment will now be described with respect to FIG. 6 using cell 602 as a target cell for programming. In the programming operation, a positive bias voltage applied to first top electrode 614 causes cell 602 to be in a low resistance state, such that an 'ON' state current flows in cell 602 during a subsequent read operation. If cell 604 is in a low resistance (e.g. programmed state), current leaking from cell 602 can cause cell 604 to be unintentionally erased. Similarly, if cell 602 is in a programmed state and to be erased, a negative voltage applied to first top electrode 614 can cause cell 608 to be unintentionally erased when cell 608 is in a low resistance state.

In various embodiments, to prevent or reduce the incidence of the leakage current from affecting operations of the selected cell or to maintain a state of an unselected cell, a rectifier or a diode may be incorporated into the design.

Figure 7:
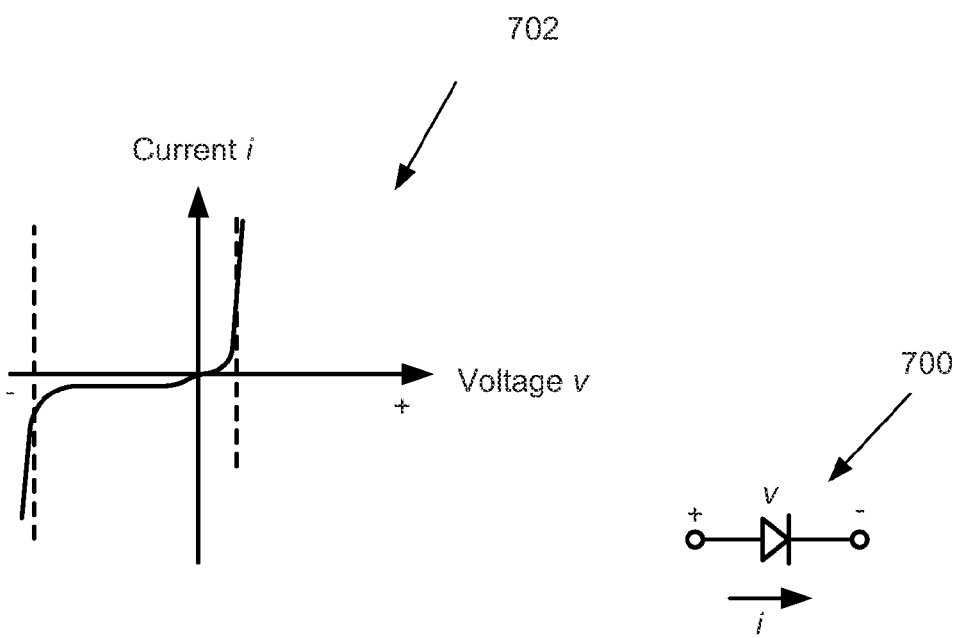
FIG. 7 is a simplified diagram illustrating a current-voltage characteristic of a conventional rectifying device.

FIG. 7 illustrates a conventional diode 700 and an IV characteristic 702 of the conventional diode. Because a conventional diode limits current flow only in one direction, the conventional diode can only reduce reverse current flow for either a program operation (e.g. positive voltage) or an erase operation (e.g. negative voltage), but typically not for both. In particular, if the conventional diode allows current to flow in a forward bias (for example, in a programming operation), the conventional diode may experience breakdown in reversed bias or during an erase operation when a current starts to flow. Similarly, a conventional diode configured to operate for a negative bias erase function may experience breakdown during a positive bias program function. After breakdown, the conventional diode becomes defective and non-functional.

Embodiments according to the present invention provide a device coupled to a resistive switching device, as described above, that addresses this breakdown issue. In various embodiments, the non-linear device is a two terminal device configured to prevent leakage current from unselected cells to interfere with proper operation of a selected cell under conditions of forward bias as well as reversed bias. The non-linear device also prevents leakage current from a selected cell during, for example programming, from unintentionally erasing one or more unselected cells or unintentionally programming one or more unselected cells. In various embodiments, the non-linear device is serially connected to the resistive switching device and can be disposed between the first electrode (FIG. 1, 106) and the resistive switching element (FIG. 1, 104) in a specific embodiment. In other embodiments, the non-linear device can be disposed between the second electrode 106 and the resistive switching element (104, 108). In a specific embodiment, the non-linear device is configured to conduct electric current when an operating voltage is applied to, for example, the second electrode 106 of the resistive switching device 100. The operating voltage includes a forward biased programming voltage and a reverse biased erase voltage in a specific embodiment.

Figure 8:
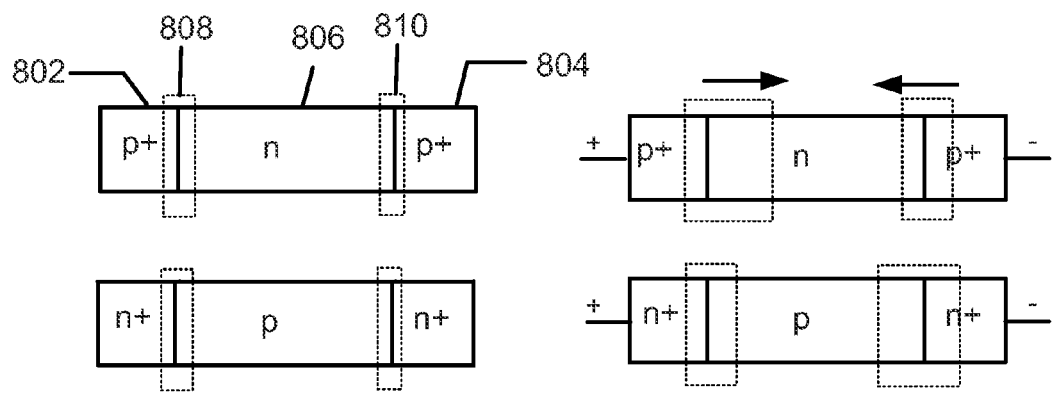
FIG. 8 is a simplified diagram illustrating a non-linear device according to an embodiment of the present invention.

Referring to FIG. 8, in a specific embodiment, the non-linear device 800 includes a first impurity region 802, a second impurity region 804, and a third impurity region 806 sandwiched between the first impurity region 802 and the second impurity region 806. In various embodiments, the first impurity region 802 and the second impurity region 804 have the same charge polarity characteristic and have substantially the same impurity concentration. The third impurity region 806 has an opposite charge polarity characteristic and a lower impurity concentration than the first impurity region 802 and the second impurity region 804. For example, as shown in FIG. 8, the non-linear device can have a pnp configuration or an npn configuration depending on the embodiment.

In operation, the non-linear device 800 is configured to conduct electric current when a voltage greater than a first voltage, or "punch-through" voltage, is applied. This type of diode may be referred to as a punch-through diode. The first voltage further causes the resistive switching device to change from a first state (e.g. non-conductive) to a second state (e.g. conductive). For example, the first state can be an off state or a high resistance state and the second state can be a programmed state or a low resistance state. In various embodiments, the first voltage can be a programming voltage or a read voltage depending on the embodiment. Embodiments according to the present invention can be applied to a one-time programmable memory device configured in an array, for example in a crossbar array.

Figure 9:
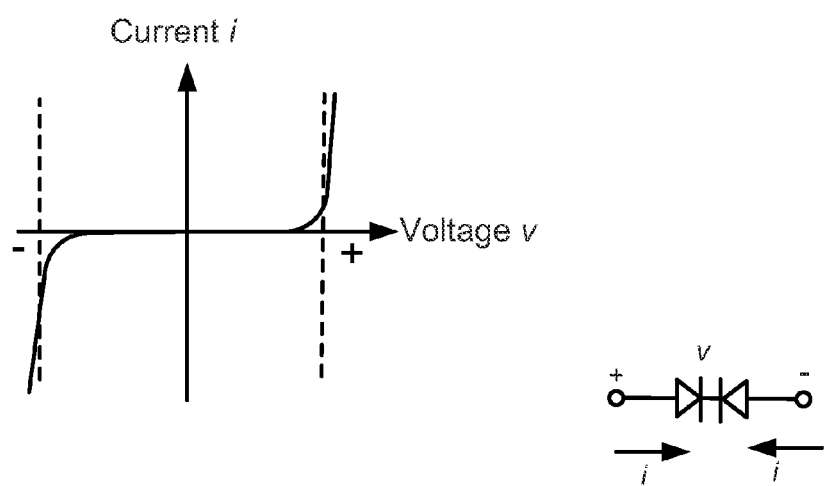
FIG. 9 is a simplified diagram illustrating a current-voltage characteristic of the non-linear device according to an embodiment of the present invention.

Referring again to FIG. 8, in various embodiments, the non-linear device 800 includes a first depletion region 808 formed from the first impurity region 802 and the third impurity region 806, and a second depletion region 810 formed from the second impurity region 804 and the third impurity region 806. When a first voltage is applied to a selected cell, (for example, in a programming operation or an erase operation), the first depletion region 808 and the second depletion region 810 expand, as illustrated. At a high enough voltage (for example, the first voltage), the two depletion regions (808 and 810) merge, so that a further increase in applied voltage would allow a current to flow and cause switching in the resistive switching device. In such a case, as voltage drop across an unselected cell is low, depletion regions of a non-linear device of the unselected cell do not expand, and little if any current flows through the unselected cell. An exemplified current-voltage (IV) characteristic of the non-linear device is illustrated in FIG. 9.

Other embodiments of the present invention may include variations to what is illustrated and described above. For example, the non-linear device can have an insulator material sandwiched between a first metal and a second metal or having a metal-insulator-metal (MIM) configuration. The non-linear device can also have a first insulator material and a second insulator material sandwiched between the first metal and the second metal or a metal-insulator-insulator-metal (M-I-I-M) configuration depending on the application. Again, the diode having MIM or MIIM configuration can be disposed between the resistive switching element and the first electrode. And alternatively, the non-linear device having MIM or MIIM configuration can be disposed between the resistive switching element and the second electrode, depending on the application.

The present invention has been exemplified using silver electrode and amorphous silicon material as resistive switching material. The non-linear device can be applied to any two terminal devices to prevent leakage current from proper operation of the two terminal device. Therefore though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device; comprising:
   a resistive switching device comprising a first electrode, a second electrode, and a resistive switching element, wherein the resistive switching element comprises a silicon material disposed in an overlapping region between the first electrode and the second electrode, wherein the second electrode comprises at least a metal material physically and electrically in contact with the resistive switching material, wherein the resistive switching element is characterized by a resistance depending on an electric field in the resistive switching element; and
   a non-linear device coupled between the first electrode and the resistive switching element, wherein the non-linear device is configured to conduct electric current when a voltage greater than a first voltage is applied to the second electrode;
   wherein the resistive switching device is configured to change from a first state to a second state in response to the first voltage.

2. The device of claim 1 wherein the silicon material is selected from group consisting of: an amorphous silicon material, a microcrystalline silicon material, a macro crystalline silicon material, a silicon germanium material.

3. The device of claim 1
   wherein the first voltage is a positive bias voltage applied to the second electrode, and
   wherein the first state is a high resistance state and the second state is a low resistance state.

4. The device of claim 1
   wherein the first voltage is a negative bias voltage applied to the second electrode, and
   wherein the first state is a low resistance state and the second state is a high resistance state.

5. The device of claim 1 wherein the non-linear device comprises a first impurity region characterized by a first polarity and a first impurity concentration, a second impurity region having the first polarity and characterized by a second impurity concentration substantially similar to the first impurity concentration, and a third impurity region characterized by a second polarity and a third impurity concentration less than or equal to the first impurity concentration, wherein the third impurity region is sandwiched between the first impurity region and the second impurity region.

6. The device of claim 1 wherein the non-linear device comprises a first metal material, a second metal material, and at least one insulating material disposed between the first metal material and the second metal material.

7. The device of claim 1 wherein the first electrode is configured to spatially extend in a first direction and the second electrode is configured to spatially extend in a second direction orthogonal to the first direction.

8. The device of claim 1 wherein the first voltage is a punch through voltage of the non-linear device.

9. The device of claim 1 wherein the first voltage is configured to provide for a write voltage for the resistive switching device.

10. The device of claim 1 wherein the first voltage is configured to provide for an erase voltage for the resistive switching device.

11. The device of claim 1
wherein the second electrode comprises a silver material disposed adjacent to the silicon material; and
wherein the silver material forms a silver region in the silicon material upon application of a positive bias voltage to the second electrode.

12. The device of claim 11 wherein the silver region further comprises a filament structure, wherein the filament structure is characterized by a characteristic selected from a group consisting of: a length or a distance between silver particles, a filament length, a filament distance to the first electrode.

13. The device of claim 11
wherein the silver region comprises a filament structure;
wherein a length of the filament structure is maintained until a voltage having a polarity opposite to the operating voltage is applied.

14. The device of claim 1 wherein the non-volatile memory device is disposed in an N by M crossbar array, where N and M are integers greater than 1.

15. The device of claim 1 wherein the non-volatile memory device is a one-time programmable memory device.

16. A method of programming a memory cell in an array of non-volatile memory devices, comprising:
providing a plurality of memory cells arranged in an array, wherein each of the plurality of memory cells comprises a resistive switching device and a non-linear device serially coupled to the resistive switching device, wherein each of the memory cells have a first current flowing in respective resistive switching devices, wherein the resistive switching device comprise at least a first electrode, a second electrode, and a resistive switching material, wherein the resistive switching material comprises a silicon material, wherein the first electrode comprises at least a silver material, and wherein the non-linear device is disposed in between the second electrode and the resistive switching material;
selecting a first memory cell; and
applying a first voltage to the first memory cell, wherein the first voltage is greater than a voltage to cause the non-linear device to conduct a first current and to cause the resistive switching device associated with the first memory cell to change from a first state to a second state, while a first current from other memory cells is blocked from flowing in the first memory cell by a second voltage drop across respective non-linear devices associated with other memory cells.

17. The method of claim 16 wherein the silicon material is selected from a group consisting of: an amorphous silicon material, a microcrystalline silicon material, a macro crystalline silicon material, a silicon germanium material.

18. The method of claim 16 further comprising allowing with the non-linear device an electric current to flow from the second electrode to the first electrode when the first voltage is a positive bias applied to the first electrode.

19. The method of claim 16 further comprising allowing an electric current to flow from the first electrode to the second electrode when the first voltage is a negative bias applied to the first electrode.

20. The method of claim 16 wherein the first current is a leakage current from each of the plurality of memory cells.

21. The method of claim 16 wherein the first memory cell is a one-time-programmable memory cell.

22. The method of claim 21 wherein the first voltage comprises a read voltage and a programming voltage for the one-time-programmable memory cell.

* * * * *